(12) United States Patent
Tabei

(10) Patent No.: US 9,040,606 B2
(45) Date of Patent: May 26, 2015

(54) EPOXY RESIN COMPOSITION FOR ENCAPSULATING SEMICONDUCTOR, SEMICONDUCTOR DEVICE, AND MOLD RELEASING AGENT

(75) Inventor: Junichi Tabei, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 100 days.

(21) Appl. No.: 13/499,923

(22) PCT Filed: Oct. 7, 2010

(86) PCT No.: PCT/JP2010/006011
§ 371 (c)(1),
(2), (4) Date: Apr. 3, 2012

(87) PCT Pub. No.: WO2011/048765
PCT Pub. Date: Apr. 28, 2011

(65) Prior Publication Data
US 2012/0199992 A1    Aug. 9, 2012

(30) Foreign Application Priority Data

Oct. 20, 2009  (JP) ................................ 2009-241427
Mar. 25, 2010  (JP) ................................ 2010-070700
Apr. 27, 2010  (JP) ................................ 2010-102429

(51) Int. Cl.
*C08L 63/00*  (2006.01)
*C08L 23/18*  (2006.01)
*C08L 35/00*  (2006.01)
(Continued)

(52) U.S. Cl.
CPC ............... *H01L 23/293* (2013.01); *C08L 23/18* (2013.01); *C08L 35/00* (2013.01); *C08L 2203/206* (2013.01); *H01L 23/3142* (2013.01); *H01L 2924/19041* (2013.01); *C08G 59/621* (2013.01); *C08L 63/00* (2013.01); *H01L 2224/48145* (2013.01); *H01L 2224/48091* (2013.01); *H01L 2224/48247* (2013.01); *H01L 2224/73265* (2013.01); *H01L 2224/32145* (2013.01);
(Continued)

(58) Field of Classification Search
USPC ................................... 523/456, 466; 526/272
See application file for complete search history.

(56) References Cited

U.S. PATENT DOCUMENTS 4,192,930 A      3/1980  Beck et al.
4,871,823 A *  10/1989  Billman et al. ............... 526/272
6,376,905 B2 *  4/2002  Hisano et al. ................. 257/690

FOREIGN PATENT DOCUMENTS

JP    61-52862 B2    11/1986
JP    6-299180 A     10/1994
(Continued)

OTHER PUBLICATIONS

Machine translation of JP 2006028264 A.*
(Continued)

*Primary Examiner* — Mark Kaucher
*Assistant Examiner* — Kregg Brooks
(74) *Attorney, Agent, or Firm* — Birch, Stewart, Kolasch & Birch, LLP

(57) ABSTRACT

Disclosed is an epoxy resin composition used for encapsulation of a semiconductor containing an epoxy resin (A), a curing agent (B), an inorganic filler (C) and a mold releasing agent, in which the mold releasing agent contains a compound (D) having a copolymer of an α-olefin having 28 to 60 carbon atoms and a maleic anhydride esterified with a long chain aliphatic alcohol having 10 to 25 carbon atoms.

9 Claims, 1 Drawing Sheet

(51) Int. Cl.
*H01L 23/29* (2006.01)
*H01L 23/31* (2006.01)
*C08G 59/62* (2006.01)

(52) U.S. Cl.
CPC ............ *H01L2224/32245* (2013.01); *H01L 2224/45144* (2013.01); *H01L 2924/1301* (2013.01)

(56) References Cited

FOREIGN PATENT DOCUMENTS

| JP | 2000-17045 A | | 1/2000 |
|---|---|---|---|
| JP | 2002-363591 A | | 12/2002 |
| JP | 2006-28264 A | | 2/2006 |
| JP | 2006028264 A | * | 2/2006 |
| JP | 2006-104415 A | | 4/2006 |
| JP | 3975386 B2 | | 9/2007 |
| JP | 4010176 B2 | | 11/2007 |
| JP | 2008-24757 A | | 2/2008 |
| JP | 2008-179791 A | | 8/2008 |
| JP | 2009144107 A | * | 7/2009 |

OTHER PUBLICATIONS

Machine translation of JP 2009144107 A.*
International Search Report for PCT/JP2010/006011 dated Nov. 9, 2010.
Office Action issued Sep. 9, 2014, in Japanese Patent Application No. 2011-537117.

* cited by examiner

EPOXY RESIN COMPOSITION FOR ENCAPSULATING SEMICONDUCTOR, SEMICONDUCTOR DEVICE, AND MOLD RELEASING AGENT

TECHNICAL FIELD

The present invention relates to an epoxy resin composition for encapsulating a semiconductor, a semiconductor device and a mold releasing agent.

BACKGROUND ART

In a semiconductor package assembly process, a method in which an aluminum electrode and an inner lead of a semiconductor chip are electrically connected by means of a gold wire by thermo-compression bonding is currently a mainstream. In recent years, with the market trends of reduction in size, lightness and high performance of electronic devices, higher integration and high pin count of electronic components are in progress year by year. Thus, a wire bonding process which is more complex than before has been demanded, and when a copper lead frame is used, oxidation of a copper surface has become more advanced by exposing to high temperature of 200 to 250 degrees centigrade over a long period of time.

Under the circumstances described above, even in a semiconductor encapsulating material excellent in adhesion to a conventional unoxidized copper surface, adhesion to copper oxide having a different surface state is inferior in many cases, so that there has been a problem of detachment during mold releasing after encapsulating with a resin or during solder reflow.

Adhesion between an inserted article and an encapsulating material resin for inhibiting detachment is an index contrary to mold releasability with respect to a mold. Thus, there has been a problem such that when adhesion is improved, mold releasability is deteriorated and molding property is lowered. With higher integration of electronic components, in order to achieve both adhesion and mold releasability, addition of a polyethylene oxide wax and a half esterified product of a copolymer of α-olefin and a maleic acid as a mold releasing agent has been proposed before oxidation of a copper frame becomes a problem (for example, see Patent Documents 1 and 2). According to this method, there has been a problem of lowering adhesion of an encapsulating resin to an oxidized copper frame with the use of a polyethylene oxide wax together, even though adhesion to an unoxidized copper and mold releasability are excellent. Furthermore, there has been a problem of deteriorating continuous molding property (mold releasability such as air vent block or the like) in a copolymer consisting of a short α-olefin moiety having equal to or less than 25 carbon atoms as a mold releasing agent (for example, see Patent Document 3).

RELATED DOCUMENT

Patent Document

Patent Document 1: Japanese Patent No. 3975386
Patent Document 2: Japanese Patent No. 4010176
Patent Document 3: Japanese Examined Patent Application Publication No. Sho 61-52862

DISCLOSURE OF THE INVENTION

The present invention has been accomplished in view of the above circumstances, and is to provide an epoxy resin composition for encapsulating a semiconductor which is excellent in adhesion to copper oxide, and also excellent in mold releasability and continuous molding property, a semiconductor device having an element encapsulated by the epoxy resin composition, and a mold releasing agent.

In order to solve the above problems, the present inventors have repeatedly conducted an extensive study and as a result, have found that the aforementioned objects are achieved by using a specific mold releasing agent for an epoxy resin composition for encapsulating a semiconductor. Thus, the present invention has been completed.

That is, the present invention is specified by matters described in below:

[1] An epoxy resin composition for encapsulating a semiconductor containing an epoxy resin (A), a curing agent (B), an inorganic filler (C) and a mold releasing agent, wherein the mold releasing agent contains a compound (D) having a copolymer of α-olefin having 28 to 60 carbon atoms and a maleic anhydride esterified with a long chain aliphatic alcohol having 10 to 25 carbon atoms.

[2] The epoxy resin composition for encapsulating a semiconductor according to [1], further containing a siloxane addition polymer modified product represented by the following general formula (I),

[Chemical Formula 1]

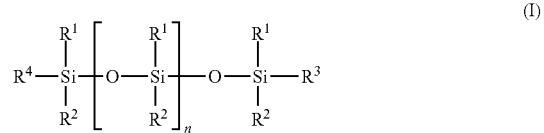

wherein, in the formula, $R^1$ to $R^2$ are selected from a hydrogen atom, a substituted or unsubstituted hydrocarbon group having 1 to 55 carbon atoms, an alkyleneoxy glycidyl ether group and an alkylene oxide group, and all may be the same or different from each other; $R^3$ to $R^4$ are selected from a hydrogen atom, a substituted or unsubstituted hydrocarbon group having 1 to 10 carbon atoms, an amino group, a carboxyl group, a glycidyl ether group and an alkylcarboxylic acid-4,4'-(1-methylethylidene)bisphenol diglycidyl ether group, and all may be the same or different from each other; and n represents an integer of from 1 to 100.

[3] The epoxy resin composition for encapsulating a semiconductor according to [1] or [2], wherein the content of the compound (D) having a copolymer of α-olefin having 28 to 60 carbon atoms and a maleic anhydride esterified with a long chain aliphatic alcohol having 10 to 25 carbon atoms is equal to or more than 55% by mass and equal to or less than 100% by mass, based on 100% by mass of the total amount of the mold releasing agent.

[4] The epoxy resin composition for encapsulating a semiconductor according to [2], wherein the content of the siloxane addition polymer modified product is equal to or more than 0.1% by mass and equal to or less than 2% by mass, based on 100% by mass of the total amount of the epoxy resin composition for encapsulating a semiconductor.

[5] The epoxy resin composition for encapsulating a semiconductor according to any one of [1] to [4], wherein the epoxy resin (A) contains at least one kind selected from the group consisting of a biphenyl type epoxy resin, a paraxylylene type epoxy resin and a phenol aralkyl type epoxy resin having a biphenylene skeleton.

[6] The epoxy resin composition for encapsulating a semiconductor according to any one of [1] to [5], used for encapsulation of a semiconductor element in a semiconductor device having a copper-containing lead frame.

[7] A semiconductor device, wherein a semiconductor element is encapsulated with a cured product of the epoxy resin composition for encapsulating a semiconductor according to any one of [1] to [6].

[8] A mold releasing agent containing a compound (D) having a copolymer of α-olefin having 28 to 60 carbon atoms and a maleic anhydride esterified with a long chain aliphatic alcohol having 10 to 25 carbon atoms.

[9] The mold releasing agent according to [8], used for an epoxy resin composition for encapsulating a semiconductor.

[10] The mold releasing agent according to [9], wherein the epoxy resin composition for encapsulating a semiconductor is used for encapsulation of a semiconductor element in a semiconductor device having a copper-containing lead frame.

Effect of the Invention

The epoxy resin composition for encapsulating a semiconductor of the present invention is excellent in adhesion to copper oxide, mold releasability and continuous molding property during molding. When electronic components such as IC, LSI and the like are encapsulated by using this epoxy resin composition for encapsulating a semiconductor, a semiconductor device excellent in the reliability can be obtained.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF EMBODIMENTS

Figure 1:
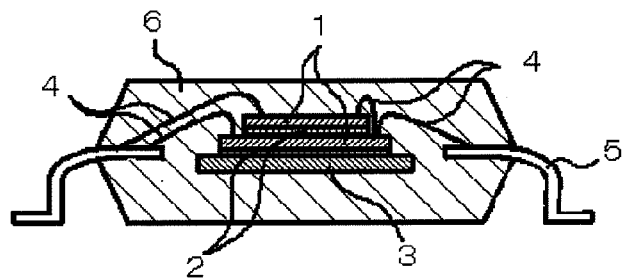
FIG. 1 is a view illustrating a cross-section structure of an example of a semiconductor device using the epoxy resin composition for encapsulating a semiconductor of the present invention.

It is preferable that the epoxy resin composition for encapsulating a semiconductor according to the present invention contains an epoxy resin (A), a curing agent (B), an inorganic filler (C) and a mold releasing agent. It is preferable that the mold releasing agent contains (D) a compound having a copolymer of α-olefin having 28 to 60 carbon atoms and a maleic anhydride esterified with a long chain aliphatic alcohol having 10 to 25 carbon atoms.

Hereinafter, respective components will be described in detail.

The epoxy resin (A) used in the present invention is not particularly limited as long as it is generally used for an epoxy resin composition for encapsulating a semiconductor. Examples include a phenol novolac type epoxy resin and an ortho-cresol novolac type epoxy resin, for example, a resin obtained by epoxidation of a novolac resin obtained in the presence of an acid catalyst by condensation of phenols such as phenol, cresol, xylenol, resorcin, catechol, bisphenol A, bisphenol F and the like, and/or naphthols such as α-naphthol, β-naphthol, dihydroxynaphthalene and the like, or by co-condensation thereof with a compound containing an aldehyde group, such as formaldehyde, acetaldehyde, propionaldehyde, benzaldehyde, salicylaldehyde or the like; diglycidyl ether of bisphenol A, bisphenol F, bisphenol S, bisphenol A/D or the like, diglycidyl ether of alkyl substituted or unsubstituted biphenol, that is, a biphenyl type epoxy resin; an epoxidized product of a phenol aralkyl resin which is synthesized from phenols and/or naphthols and dimethoxy paraxylene or bis(methoxymethyl)biphenyl; a stilbene type epoxy resin; a hydroquinone type epoxy resin; a glycidyl ester type epoxy resin obtained by reacting a polybasic acid such as phthalic acid, dimeric acid or the like with epichlorohydrin; a glycidyl amine type epoxy resin obtained by reacting a polyamine such as diaminodiphenyl methane, isocyanuric acid or the like with epichlorohydrin; an epoxidized product of a resin obtained by co-condensation of dicyclopentadiene with phenols, that is, a dicyclopentadiene type epoxy resin; an epoxy resin having a naphthalene ring; a triphenol methane type epoxy resin; a trimethylol propane type epoxy resin; a terpene-modified epoxy resin; a linear aliphatic epoxy resin obtained by oxidizing olefin bonds with a peracid such as peracetic acid or the like; an aliphatic epoxy resin; and an epoxy resin obtained by subjecting these epoxy resins to modification by silicon, acrylonitrile, butadiene, isoprene rubber, a polyamide type resin or the like. These may be used singly or may be used in combination of two or more kinds.

Among these, preferably used are a biphenyl type epoxy resin represented by the following general formula (II), a paraxylylene type epoxy resin represented by the following general formula (III) and a phenol aralkyl type epoxy resin having a biphenylene skeleton represented by the following general formula (IV) from the viewpoint of adhesion to copper oxide,

[Chemical Formula 2]

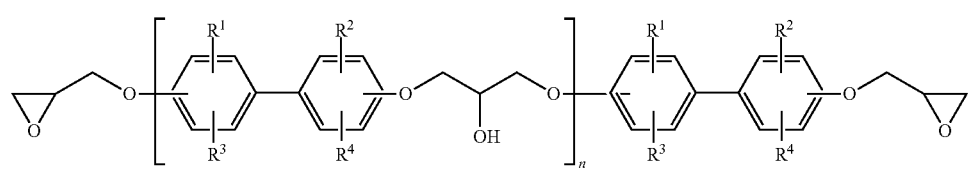

(II)

wherein, in the general formula (II), $R^1$ to $R^4$ are selected from a hydrogen atom and a substituted or unsubstituted monovalent hydrocarbon group having 1 to 10 carbon atoms, and all may be the same or different from each other; and n represents an integer of from 0 to 3,

[Chemical Formula 3]

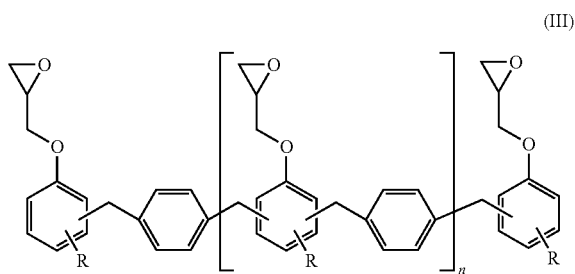

(III)

wherein, in the general formula (III), R is selected from a hydrogen atom and a substituted or unsubstituted monovalent hydrocarbon group having 1 to 10 carbon atoms; and n represents an integer of from 0 to 20,

[Chemical Formula 4]

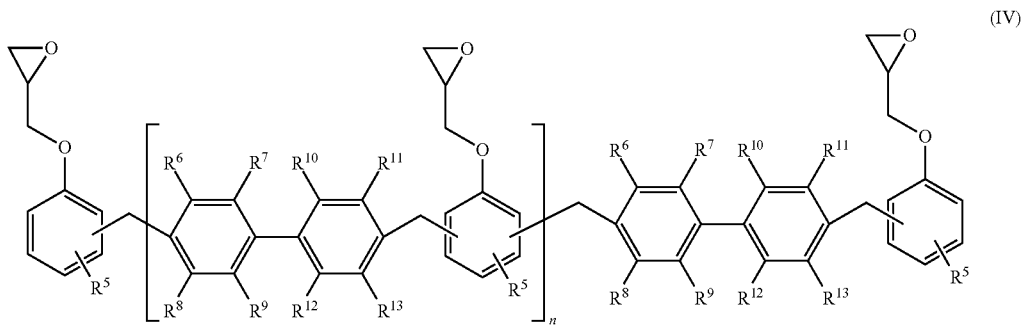

(IV)

wherein, in the general formula (IV), $R^5$ to $R^{13}$ are selected from a hydrogen atom and a substituted or unsubstituted monovalent hydrocarbon group having 1 to 10 carbon atoms, and all may be the same or different from each other; and n represents an integer of from 0 to 3.

$R^1$ to $R^4$ in the aforementioned general formula (II) are selected from a hydrogen atom, an alkyl group having 1 to 10 carbon atoms such as a methyl group, an ethyl group, a propyl group, a butyl group, an isopropyl group, an isobutyl group or the like; an alkoxyl group having 1 to 10 carbon atoms such as a methoxy group, an ethoxy group, a propoxy group, a butoxy group or the like; an aryl group having 6 to 10 carbon atoms such as a phenyl group, a tolyl group, a xylyl group or the like; and an aralkyl group having 6 to 10 carbon atoms such as a benzyl group, a phenethyl group or the like. Among these, preferably used are a hydrogen atom and a methyl group. Examples of the aforementioned biphenyl type epoxy resin represented by the general formula (II) include an epoxy resin mainly composed of 4,4'-bis(2,3-epoxypropoxy)biphenyl or 4,4'-bis(2,3-epoxypropoxy)-3,3',5,5'-tetramethylbiphenyl, an epoxy resin obtained by reacting epichlorohydrin with 4,4'-biphenol or 4,4'-(3,3',5,5'-tetramethyl)biphenol, and the like. Among these, more preferably used is an epoxy resin mainly composed of 4,4'-bis(2,3-epoxypropoxy)-3,3',5,5'-tetramethylbiphenyl. For example, YX-4000K, YX-4000H (product names, manufactured by Japan Epoxy Resin Co., Ltd.) and the like are available as a commercial product. With the use of this biphenyl type epoxy resin, adhesion to copper oxide is improved. Its mixing amount is preferably equal to or more than 20% by mass, more preferably equal to or more than 30% by mass and further preferably equal to or more than 50% by mass, based on the total amount of the epoxy resin, to exhibit its performance.

R in the aforementioned general formula (III) is selected from a hydrogen atom, an alkyl group having 1 to 10 carbon atoms such as a methyl group, an ethyl group, a propyl group, a butyl group, an isopropyl group, an isobutyl group or the like; an alkoxyl group having 1 to 10 carbon atoms such as a methoxy group, an ethoxy group, a propoxy group, a butoxy group or the like; an aryl group having 6 to 10 carbon atoms such as a phenyl group, a tolyl group, a xylyl group or the like; and an aralkyl group having 6 to 10 carbon atoms such as a benzyl group, a phenethyl group or the like. Among these, preferably used are a hydrogen atom and a methyl group. As the aforementioned paraxylylene type epoxy resin represented by the general formula (III), more preferably used is an epoxy resin mainly composed of n=0. For example, NC2000 (product name, manufactured by Nippon Kayaku Co., Ltd.) and the like are available as a commercial product. With the use of this paraxylylene type epoxy resin, its mixing amount is preferably equal to or more than 10% by mass and more preferably equal to or more than 20% by mass, based on the total amount of the epoxy resin, to exhibit its performance.

$R^5$ to $R^{13}$ in the aforementioned general formula (IV) are selected from a hydrogen atom, an alkyl group having 1 to 10 carbon atoms such as a methyl group, an ethyl group, a propyl group, a butyl group, an isopropyl group, an isobutyl group or the like; an alkoxyl group having 1 to 10 carbon atoms such as a methoxy group, an ethoxy group, a propoxy group, a butoxy group or the like; an aryl group having 6 to 10 carbon atoms such as a phenyl group, a tolyl group, a xylyl group or the like; and an aralkyl group having 6 to 10 carbon atoms such as a benzyl group, a phenethyl group or the like. Among these, preferably used are a hydrogen atom and a methyl group. As the phenol aralkyl type epoxy resin having a biphenylene skeleton represented by the aforementioned general formula (IV), more preferably used is an epoxy resin mainly composed of n=0. For example, NC-3000L (product name, manufactured by Nippon Kayaku Co., Ltd.) and the like are available as a commercial product. With the use of this phenol aralkyl type epoxy resin having a biphenylene skeleton, its mixing amount is preferably equal to or more than 10% by mass and more preferably equal to or more than 20% by mass, based on the total amount of the epoxy resin, to exhibit its performance.

The aforementioned biphenyl type epoxy resin represented by the general formula (II), the aforementioned paraxylylene type epoxy resin represented by the general formula (III) and the aforementioned phenol aralkyl type epoxy resin having a biphenylene skeleton represented by the general formula (IV) may be used singly or may be used in combination of two or more kinds. When two or more kinds thereof are used together, the mixing amount thereof is preferably equal to or more than 50% by mass and more preferably equal to or more than 70% by mass, based on the total amount of the epoxy resin (A).

The content of the epoxy resin (A) according to the present invention is not particularly limited, but it is preferably equal to or more than 0.8% by mass and equal to or less than 12% by mass, and more preferably equal to or more than 1.5% by mass and equal to or less than 10% by mass, based on 100% by mass of the total amount of the epoxy resin composition for encapsulating a semiconductor.

The curing agent (B) used in the present invention is not particularly limited as long as it is generally used for an epoxy resin composition for encapsulating a semiconductor, and it may be, for example, a phenol resin. Such a phenol resin type curing agent may generally be monomers, oligomers, or polymers having two or more phenolic hydroxyl groups in one molecule. The molecular weight and molecular structure thereof are not particularly limited, and examples include a phenol novolac resin and a cresol novolac resin, for example, a resin obtained in the presence of an acid catalyst by condensation of phenols such as phenol, cresol, resorcin, catechol, bisphenol A, bisphenol F, phenylphenol, aminophenol and the like, and/or naphthols such as α-naphthol, β-naphthol, dihydroxynaphthalene and the like, or by co-condensation thereof with a compound containing an aldehyde group such as formaldehyde or the like; and a phenol aralkyl resin which is synthesized from phenols and/or naphthols and dimethoxy paraxylene or bis(methoxymethyl)biphenyl. These may be used singly or may be used in combination of two or more kinds.

Among these, preferably used is a phenol aralkyl resin having a biphenylene skeleton represented by the following general formula (V) from the viewpoints of low viscosity and low moisture absorption, an ethoxy group, a propoxy group, a butoxy group or the like; an aryl group having 6 to 10 carbon atoms such as a phenyl group, a tolyl group, a xylyl group or the like; and an aralkyl group having 6 to 10 carbon atoms such as a benzyl group, a phenethyl group or the like. Among these, preferably used are a hydrogen atom and a methyl group. Examples of the aforementioned phenol aralkyl resin having a biphenylene skeleton represented by the general formula (V) include compounds in which all of $R^{14}$ to $R^{22}$ are each a hydrogen atom and the like. Among these, preferably used is a mixture of a condensation product containing the condensation product of equal to or more than 50% by mass in which n is equal to or more than 1, from the viewpoint of the melt viscosity. As such a compound, MEH-7851SS (product name, manufactured by Meiwa Plastic Industries, Ltd.) is available as a commercial product. With the use of this phenol aralkyl resin having a biphenylene skeleton, its mixing amount is preferably equal to or more than 50% by mass and more preferably equal to or more than 70% by mass, based on the total amount of the curing agent (B), to exhibit its performance.

The content of the curing agent (B) according to the present invention is not particularly limited, but it is preferably equal to or more than 0.8% by mass and equal to or less than 12% by mass, and more preferably equal to or more than 1.5% by mass and equal to or less than 10% by mass, based on 100% by mass of the total amount of the epoxy resin composition for encapsulating a semiconductor.

The equivalent ratio of the epoxy resin (A) to the curing agent (B), that is, the ratio of the number of epoxy groups of the epoxy resin (A) to the number of hydroxyl groups of the curing agent (B), is not particularly limited, but it is preferably set in the range of 0.5 to 2 and more preferably in the range of 0.6 to 1.5 in order to suppress respective unreacted contents as low as possible. In order to obtain an epoxy resin composition for encapsulating a semiconductor excellent in molding property and reflow resistance, it is further preferably set in the range of 0.8 to 1.2.

The epoxy resin composition for encapsulating a semiconductor of the present invention may further contain a curing accelerator (E). The curing accelerator (E) is not particularly

[Chemical Formula 5]

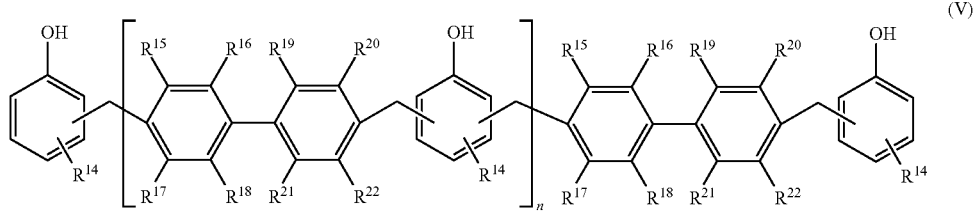

wherein, in the general formula (V), $R^{14}$ to $R^{22}$ are selected from a hydrogen atom and a substituted or unsubstituted monovalent hydrocarbon group having 1 to 10 carbon atoms, and all may be the same or different from each other; and n represents an integer of from 0 to 10.

All of $R^{14}$ to $R^{22}$ in the above formula (V) may be the same or different from each other, and are selected from a hydrogen atom and a substituted or unsubstituted monovalent hydrocarbon group having 1 to 10 carbon atoms, for example, an alkyl group having 1 to 10 carbon atoms such as a methyl group, an ethyl group, a propyl group, a butyl group, an isopropyl group, an isobutyl group or the like; an alkoxyl group having 1 to 10 carbon atoms such as a methoxy group, limited as long as it is generally used for an epoxy resin composition for encapsulating a semiconductor. Examples thereof include cycloamidine compounds such as 1,8-diazabicyclo(5,4,0)undecene-7, 1,5-diaza-bicyclo(4,3,0)nonene, 5,6-dibutylamino-1,8-diaza-bicyclo(5,4,0)undecene-7 and the like; tertiary amine compounds such as benzyldimethylamine, triethanolamine, dimethylaminoethanol, tris(dimethylaminomethyl)phenol and the like, and their derivatives; imidazole compounds such as 2-methylimidazole, 2-phenylimidazole, 2-phenyl-4-methylimidazole and the like, and their derivatives; organic phosphines such as tributylphosphine, methyldiphenylphosphine, triphenylphosphine, tris(4-methylphenyl)phosphine, diphenylphosphine, phenylphosphine and the like; organophosphorous compounds such as a compound having an intramolecular polarization, obtained by addition of the above organic phosphines and a quinone compound such as 1,4-benzoquinone, 2,5-toluquinone, 1,4-naphthoquinone, 2,3-dimethylbenzoquinone, 2,6-dimethyl-benzoquinone, 2,3-dimethoxy-5-methyl-1,4-benzoquinone, 2,3-dimethoxy-1,4-benzoquinone, phenyl-1,4-benzoquinone or the like, or a compound having π-bonds such as bisphenol A, bisphenol F, bisphenol S, a phenol resin or the like; and tetraphenyl boron salts such as tetraphenyl phosphonium tetraphenyl borate, triphenyl phosphine tetraphenyl borate and the like, and their derivatives. These may be used singly or may be used in combination of two or more kinds. Among these, from the viewpoint of molding property, preferably used is an organophosphorous compound, more preferably used are organic phosphine and an adduct of organic phosphine and a quinone compound, and further preferably used are triphenylphosphine and an adduct of tertiary phosphine such as triphenylphosphine, tris(4-methylphenyl)phosphine, tris(4-methoxyphenyl)phosphine or the like and a quinine compound such as p-benzoquinone, 1,4-naphthoquinone or the like.

The mixing amount of the curing accelerator (E) is not particularly limited as long as the curing acceleration effect is achieved, but it is preferably from 0.1 to 10% by mass and more preferably from 1 to 5% by mass, based on 100% by mass of the total amount of the epoxy resin (A). When it is less than the lower limit, curability in a short time period range tends to be inferior. When it exceeds the upper limit, the curing rate tends to be too high and it tends to be difficult to produce an excellent molded product due to insufficient filling or the like.

The inorganic filler (C) used in the present invention is mixed in order to reduce moisture absorption and linear expansion coefficient, and to improve thermal conductivity and strength. Examples thereof include powders of fused silica, crystal silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite or titania, ensphered beads produced therefrom, glass fibers and the like. Furthermore, examples of an inorganic filler having a flame retardant effect include aluminum hydroxide, magnesium hydroxide, zinc borate, zinc molybdate and the like. These inorganic fillers may be used singly or may be used in combination of two or more kinds. Among the aforementioned inorganic fillers (C), fused silica is preferable from the viewpoint of reduction in the linear expansion coefficient, alumina is preferable from the viewpoint of higher thermal conductivity, and the shape of the filler is preferably spherical from the viewpoint of flowability during molding and abrasion of molds.

The mixing amount of the inorganic filler (C) is preferably equal to or more than 80% by mass, more preferably in the range of 82 to 96% by mass and further preferably in the range of 86 to 92% by mass, based on 100% by mass of the total amount of the epoxy resin composition for encapsulating a semiconductor, from the viewpoint of molding property, reduction in moisture absorption and linear expansion coefficient, and improvement in strength. When it is less than the lower limit, the reliability tends to be lowered. When it exceeds the upper limit, the molding property tends to be lowered.

The mold releasing agent used in the present invention contains a compound (D) having a copolymer of α-olefin having 28 to 60 carbon atoms and a maleic anhydride esterified with a long chain aliphatic alcohol having 10 to 25 carbon atoms (hereinafter referred to as the compound (D)). This compound (D) is highly dispersible in the epoxy resin (A) and effective in improvement in adhesion to copper oxide and mold releasability.

The α-olefin having 28 to 60 carbon atoms used for the compound (D) is not particularly limited, and examples thereof include linear α-olefins such as 1-octacosene, 1-triacontene, 1-hentriacontene, 1-dotriacontene, 1-tritriacontene, 1-tetratriacontene, 1-pentatriacontene, 1-hexatriacontene, 1-tetracontene, 1-hentetracontene, 1-dotetracontene, 1-tritetracontene, 1-tetratetracontene, 1-pentacontene, 1-henpentacontene, 1-dopentacontene, 1-tripentacontene, 1-pentapentacontene, 1-hexacontene and the like; and branched α-olefins such as 3-methyl-1-triacontene, 3,4-dimethyl-triacontene, 3-methyl-1-tetracontene, 3,4-dimethyl-tetracontene and the like. These may be used singly or may be used in combination of two or more kinds.

When the carbon number of α-olefin used for the compound (D) is less than the lower limit, continuous molding property (mold releasability) is deteriorated. When it exceeds the upper limit, adhesion to copper oxide is lowered.

Monohydric alcohol having 10 to 25 carbon atoms used for the compound (D) is not particularly limited, and examples thereof include linear or branched aliphatic saturated alcohols such as decyl alcohol, undecyl alcohol, lauryl alcohol, tridecyl alcohol, myristyl alcohol, pentadecyl alcohol, cetyl alcohol, heptadecyl alcohol, stearyl alcohol, nonadecyl alcohol, eicosyl alcohol and the like; linear or branched aliphatic unsaturated alcohols such as hexenol, 2-hexene-1-ol, 1-hexene-3-ol, panthenol, 2-methyl-1-penthenol and the like; alicyclic alcohols such as cyclopentanol, cyclohexanol and the like; aromatic alcohols such as benzyl alcohol, cinnamyl alcohol and the like; and heterocyclic alcohols such as furfuryl alcohol and the like. These may be used singly or may be used in combination of two or more kinds. Linear alcohol having 10 to 22 carbon atoms is preferable, while linear aliphatic saturated alcohol having 15 to 20 carbon atoms is more preferable.

When the carbon number of monohydric alcohol used for the compound (D) is less than the lower limit, continuous molding property (mold releasability) is deteriorated. When it exceeds the upper limit, adhesion to copper oxide is lowered.

The copolymer of α-olefin having 28 to 60 carbon atoms and a maleic anhydride in the compound (D) according to the present invention is not particularly limited, and examples thereof include a compound represented by the following general formula (VI), a compound represented by the following general formula (VII) and the like. As a commercial product, Diacarna (registered trademark) 30 (product name, manufactured by Mitsubishi Chemical Corporation) using a raw material such as 1-octacosene, 1-triacontene, 1-tetracontene, 1-pentacontene, 1-hexacontene or the like is available.

[Chemical Formula 6]

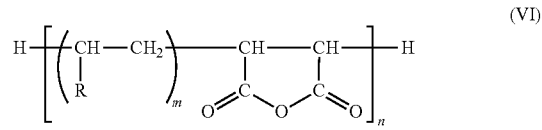

(VI)

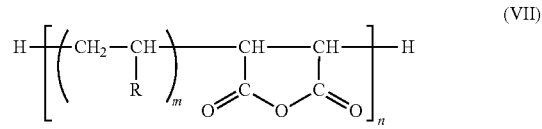

(VII)

wherein, in the above general formulae (VI) and (VII), R represents a monovalent aliphatic hydrocarbon group having 26 to 56 carbon atoms; n is an integer of equal to or more than 1; and m represents the copolymerization ratio of the α-olefin to the maleic anhydride which is not particularly limited, but when the α-olefin is X mole and maleic anhydride is Y mole, X/Y, that is, m is preferably from 1/2 to 10/1 and more preferably an approximately equimolar amount of around 1/1.

A method for producing a copolymer of α-olefin having 28 to 60 carbon atoms and a maleic anhydride is not particularly limited, and a general copolymerization method involving reacting raw materials may be used. For the reaction, an organic solvent capable of dissolving α-olefin and maleic anhydride or the like may be used. The organic solvent is not particularly limited, but toluene is preferable. An aromatic solvent, an ether solvent, a halogen solvent and the like may also be used. The reaction temperature is different depending on the kind of the organic solvent in use, but it is preferably from 50 to 200 degrees centigrade and more preferably from 100 to 150 degrees centigrade from the viewpoints of the reactivity and productivity. The reaction time is not particularly limited as long as a copolymer is obtained, but it is preferably from 1 to 30 hours, more preferably from 2 to 15 hours and further preferably from 4 to 10 hours from the viewpoint of the productivity. After completion of the reaction, the unreacted components, the solvent and the like may be removed under heating and reduced pressure, as necessary. As the conditions, the temperature is preferably from 100 to 220 degrees centigrade and more preferably from 120 to 180 degrees centigrade, the pressure is preferably equal to or less than $13.3 \times 10^3$ Pa and more preferably equal to or less than $8 \times 10^3$ Pa, and the time is preferably from 0.5 to 10 hours. Furthermore, for the reaction, a radical polymerization initiator such as azobisisobutyronitrile (AIBN), benzoyl peroxide (BPO) or the like may be added, as necessary.

A method for esterifying a copolymer of α-olefin having 28 to 60 carbon atoms and a maleic anhydride with monohydric alcohol having 10 to 25 carbon atoms is not particularly limited, and there is a general method involving carrying out an addition reaction of monohydric alcohol with the copolymer. The reaction molar ratio of the copolymer of α-olefin having 28 to 60 carbon atoms and a maleic anhydride to monohydric alcohol is not particularly limited and can be arbitrarily set. However, since the degree of hydrophilic property can be controlled by adjusting this reaction molar ratio, it is preferable that the reaction molar ratio is properly set according to a desired molding material for encapsulation. For the reaction, an organic solvent capable of dissolving α-olefin and maleic anhydride or the like may be used. The organic solvent is not particularly limited, but toluene is preferable. An aromatic solvent, an ether solvent, a halogen solvent and the like may also be used. The reaction temperature is different depending on the kind of the organic solvent in use, but it is preferably from 50 to 200 degrees centigrade and more preferably 100 to 150 degrees centigrade from the viewpoints of the reactivity and productivity. The reaction time is not particularly limited as long as a copolymer is obtained, but it is preferably from 1 to 30 hours, more preferably from 2 to 15 hours and further preferably from 4 to 10 hours from the viewpoint of the productivity. After completion of the reaction, the unreacted components, the solvent and the like may be removed under heating and reduced pressure, as necessary. As the conditions, the temperature is preferably from 100 to 220 degrees centigrade and more preferably from 120 to 180 degrees centigrade, the pressure is preferably equal to or less than $13.3 \times 10^3$ Pa and more preferably equal to or less than $8 \times 10^3$ Pa, and the time is preferably from 0.5 to 10 hours. Furthermore, for the reaction, a reaction catalyst, for example, an amine catalyst such as triethylamine, N,N-dimethylaminopyridine or the like, and an acid catalyst such as sulfuric acid, para-toluenesulfonic acid or the like may be added, as necessary.

Examples of the compound (D) include compounds containing one or more kinds selected from diesters represented by the following formulae (a) and (b), and monoesters represented by the formulae (c) to (f) in the structure as a repeating unit and the like, and the compound (D) may contain non-ester represented by the formula (g) or (h). Examples of such a compound include (1) a compound composed of any one kind alone of (a) to (f), (2) a compound containing two or more kinds of (a) to (f) at random, regularly or in blocks, (3) a compound containing one or more kinds of (a) to (f) and (g) and/or (h) at random, regularly or in blocks in the main chain skeleton, and the like. These may be used singly or may be used in combination of two or more kinds. Furthermore, the compound (D) may contain (4) a compound containing (g) and (h) at random, regularly or in blocks, and/or (5) a compound containing each of (g) or (h) alone. The esterification rate of the component (D) is preferably equal to or more than 20% by mole from the viewpoints of mold releasability and adhesion. As the compound (D), preferably used is a compound containing equal to or more than 20% by mole of one or more kinds of monoesters represented by the formulae (c) to (f) in total, while more preferably used is a compound containing equal to or more than 30% by mole.

[Chemical Formula 7]

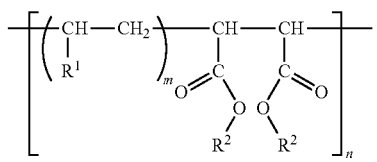

(a)

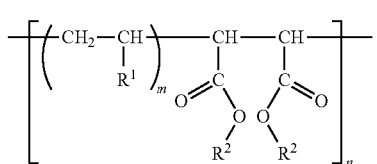

(b)

[Chemical Formula 8]

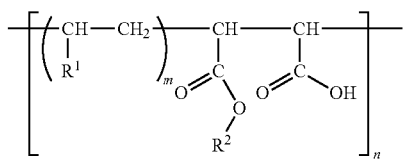

(c)

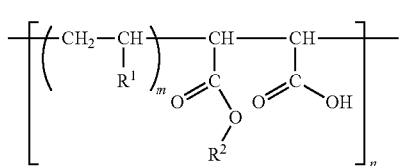

(d)

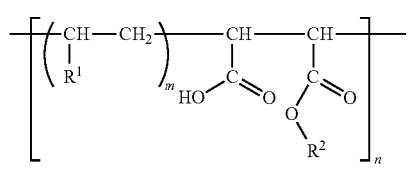
(e)

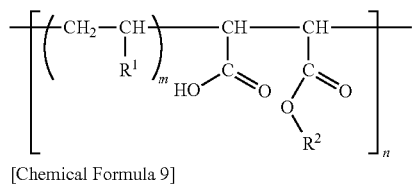
(f)

[Chemical Formula 9]

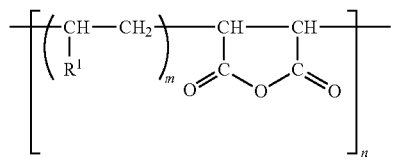
(g)

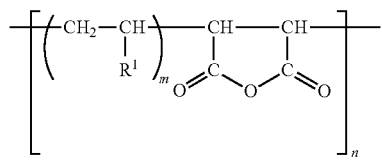
(h)

wherein, in the above formulae (a) to (h), $R^1$ represents a monovalent aliphatic hydrocarbon group having 26 to 56 carbon atoms; $R^2$ represents a monovalent hydrocarbon group having 10 to 25 carbon atoms; and m represents the copolymerization molar ratio of α-olefin (X) to the maleic anhydride (Y), that is, X/Y, and m is preferably from 1/2 to 10/1 and more preferably around 1/1.

The number average molecular weight of the compound (D) is not particularly limited as long as the repeating unit is equal to or more than 1. Excellent adhesion to copper oxide and mold releasability may be achieved in any molecular weight region, but the number average molecular weight is preferably from 2,000 to 10,000.

Even though the compound (D) contains the unreacted α-olefin in an amount of 0 to 33% by mass, continuous molding property and adhesion to copper oxide are not changed. However, when the content exceeds the upper limit, a surface of a molded product tends to be contaminated (package stain) remarkably.

The mixing amount of the compound (D) is not particularly limited, but it is preferably from 0.5 to 10% by mass and more preferably from 1 to 5% by mass, based on 100% by mass of the total amount of the epoxy resin (A). When the mixing amount is less than the lower limit, mold releasability tends to be lowered. When it exceeds the upper limit, adhesion to copper oxide tends to be insufficient.

In the epoxy resin composition for encapsulating a semiconductor of the present invention, a conventionally known mold releasing agent such as carnauba wax, montanoic acid, stearic acid, high fatty acid, metal salt of high fatty acid, ester type wax such as montanoic acid ester or the like, polyethylene, or polyolefin type wax may be used as a mold releasing agent together with the compound (D) in the ranges in which the effect of the present invention can be achieved.

Meanwhile, the content of the compound (D) is not particularly limited, but it is preferably equal to or more than 55% by mass and equal to or less than 100% by mass, based on 100% by mass of the total amount of the mold releasing agent. When the content is in such a range, excellent adhesion to copper oxide and mold releasability are achieved.

The siloxane addition polymer modified product used in the present invention is a modified silicon oil obtained by substituting a part of the methyl substituent of dimethylsiloxane with a substituent such as an alkyl group, an epoxy group, a carboxyl group, an amino group or the like, represented by the following general formula (I), which is excellent in the affinity with the resin. Thus, an epoxy resin composition for encapsulating a semiconductor excellent in solder stress resistance and flowability can be obtained. Furthermore, the modified product has the effect of dispersing the mold releasing agent in the resin, and the effect of enhancing the mold releasing effect without lowering adhesion is also expected. One or more of the aforementioned siloxane addition polymer modified products may be used in combination in an amount of from 0.1 to 2% by mass, based on the total amount of the epoxy resin composition for encapsulating a semiconductor. However, when the amount of the siloxane addition polymer modified product exceeds the upper limit, the surface is easily contaminated and there is the possibility of causing resin bleeding for a longer period of time. When it is less than the lower limit, sufficient low elastic modulus and dispersibility of the mold releasing agent are not achieved in some cases.

[Chemical Formula 10]

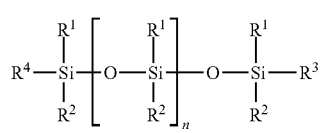
(I)

wherein, in the general formula (I), $R^1$ to $R^2$ are selected from a hydrogen atom, a substituted or unsubstituted hydrocarbon group having 1 to 55 carbon atoms, an alkyleneoxy glycidyl ether group and an alkylene oxide group, and all may be the same or different from each other; $R^3$ to $R^4$ are selected from a hydrogen atom, a substituted or unsubstituted hydrocarbon group having 1 to 10 carbon atoms, an amino group, a carboxyl group, a glycidyl ether group and an alkylcarboxylic acid-4,4'-(1-methylethylidene)bisphenol diglycidyl ether group, and all may be the same or different from each other; and n represents an integer of from 1 to 100.

From the viewpoint of improvement in moisture resistance and high temperature storage property of semiconductor elements such as IC and the like, an anion exchanger may be added to the epoxy resin composition for encapsulating a semiconductor of the present invention. The anion exchanger is not particularly limited, and all publicly known anion exchangers can be used. Examples thereof include hydrotalcites and hydrate oxides of the element selected from antimony, bismuth, zirconium, titanium, tin, magnesium and aluminum. These may be used singly or may be used in combination of two or more kinds. Among these, a hydrotalcite represented by the following general formula (VIII) and hydrate oxide of bismuth are preferable.

$$Mg_{1-x}Al_x(OH)_2(CO_3)_{x/2} \cdot mH_2O \qquad (VIII)$$

wherein, 0<X≤0.5; and m is a positive number.

The mixing amount of the anion exchanger is not particularly limited as far as the amount thereof is enough to capture ionic impurities such as halogen ions, but it is preferably from 0.1 to 30% by mass, more preferably from 1 to 10% by mass and further preferably from 2 to 5% by mass, based on 100% by mass of the total amount of the epoxy resin (A). When the mixing amount is less than the lower limit, capturing of ionic impurities tends to be insufficient. When it exceeds the upper limit, there is no big difference in the effect as compared to a case when the amount is equal to or less than the upper limit so that it is economically unfavorable.

In order to improve adhesion between the resin component and the inorganic filler, any one of known coupling agents including various silane compounds such as epoxysilane, mercaptosilane, aminosilane, alkylsilane, ureidosilane, vinylsilane and the like, titanium compounds, aluminum chelate compounds, aluminum/zirconium compounds and the like may be added to the epoxy resin composition for encapsulating a semiconductor of the present invention, as necessary. Examples thereof include silane coupling agents such as vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropyltriethoxysilane, vinyltriacetoxysilane, γ-mercaptopropyltrimethoxysilane, γ-mercaptopropylmethyldimethoxysilane, γ-mercaptopropyltriethoxysilane, γ-aminopropyltrimethoxysilane, γ-aminopropylmethyldimethoxysilane, γ-aminopropyltriethoxysilane, γ-anilinopropyltrimethoxysilane, γ-anilinopropylmethyldimethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, N-β-(N-vinylbenzylaminoethyl)-γ-aminopropyltrimethoxysilane, γ-chloropropyltrimethoxysilane, hexamethyldisilane, vinyltrimethoxysilane and the like; and titanate coupling agents such as isopropyltriisostearoyl titanate, isopropyl tris(dioctylpyrophosphate)titanate, isopropyl tri(N-aminoethyl-aminoethyl)titanate, tetraoctyl bis(ditridecylphosphite)titanate, tetra(2,2-diallyloxymethyl-1-butyl)bis(ditridecyl) phosphite titanate, bis(dioctylpyrophosphate)oxyacetate titanate, bis(dioctylpyrophosphate)ethylene titanate, isopropyl trioctanoyl titanate, isopropyl dimethacryl isostearoyl titanate, isopropyl tridodecylbenzenesulfonyl titanate, isopropyl isostearoyl diacryl titanate, isopropyl tri(dioctylphosphate)titanate, isopropyl tricumylphenyl titanate, tetraisopropyl bis(dioctylphosphite)titanate and the like. These may be used singly or may be used in combination of two or more kinds.

The mixing amount of the aforementioned coupling agent is preferably from 0.05 to 5% by mass and more preferably from 0.1 to 2.5% by mass, based on 100% by mass of the total amount of the inorganic filler (C). When it is less than the lower limit, moisture resistance tends to be lowered. When it exceeds the upper limit, molding property of a package tends to be lowered.

Furthermore, other additives may be mixed to the epoxy resin composition for encapsulating a semiconductor of the present invention, as necessary. Examples thereof include flame retardants such as known organic or inorganic compounds containing a halogen atom, an antimony atom, a nitrogen atom or a phosphorus atom, metal hydroxides and the like, such as a brominated epoxy resin, antimony trioxide, antimony tetroxide, antimony pentoxide and the like; coloring agents such as carbon black, organic dye, organic pigment, titanium oxide, red lead, bengala and the like; and adhesion promoters such as imidazole, triazole, tetrazole, triazine and their derivatives, antranilic acid, gallic acid, malonic acid, malic acid, maleic acid, aminophenol, quinoline and their derivatives, an aliphatic acid amide compound, a dithiocarbamic acid salt, thiadiazole derivatives and the like.

The epoxy resin composition for encapsulating a semiconductor of the present invention can be prepared by any method as long as various raw materials can be uniformly dispersed and mixed. As a general method, there may be exemplified a method in which raw materials of predetermined mixing amounts are thoroughly mixed by a mixer or the like, and melted and kneaded with a mixing roll, a kneader, an extruder or the like followed by cooling and pulverizing into powder. For easier handling, it is preferable to prepare a tablet with appropriate size and mass corresponding to molding conditions.

Furthermore, the epoxy resin composition for encapsulating a semiconductor of the present invention is dissolved in various organic solvents and can be used as a liquid epoxy resin composition for encapsulating a semiconductor. This liquid epoxy resin composition for encapsulating a semiconductor is thinly applied on a board or a film, and can also be used as an epoxy resin composition for encapsulating a semiconductor in a sheet or film form obtained by dispersing an organic solvent under the conditions in which the curing reaction of the resin does not proceed much.

Examples of the semiconductor device obtained by encapsulating elements by the epoxy resin composition for encapsulating a semiconductor obtained in the present invention include a semiconductor device in which elements (for example, active elements such as semiconductor chip, transistor, diode, thyristor and the like) and passive elements (for example, capacitor, resistance, coil and the like) are mounted onto a supporting member such as a copper lead frame, and whose necessary part(s) is encapsulated with the epoxy resin composition for encapsulating a semiconductor of the present invention, and the like. Examples of such a semiconductor device include common resin encapsulated type ICs such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package), TQFP (Thin Quad Flat Package) and the like, in which semiconductor elements are fixed on the copper lead frame and the terminals of the elements such as bonding pads and the leads are connected by wire bonding or bumps, and then the elements are encapsulated by transfer molding using the epoxy resin composition for encapsulating a semiconductor of the present invention.

FIG. 1 is a view illustrating a cross-section structure of an example of a semiconductor device using the epoxy resin composition for encapsulating a semiconductor according to the present invention. Two semiconductor elements 1 are respectively fixed on a die pad 3 through respective two cured die bond materials 2, which are laminated. Electrode pads of the semiconductor elements 1 and a copper lead frame 5 are connected by gold wires 4. The semiconductor elements 1 are encapsulated with a cured product 6 of the resin composition for encapsulating a semiconductor. As the copper lead frame 5, preferably used are general-purpose copper-containing lead frames which are generally used in the technical field of the semiconductor device. The copper-containing lead frame is not particularly limited as far as copper is contained, and preferably used are a lead frame containing copper at least on the surface, a lead frame of a copper alloy, a lead frame composed of copper, and the like.

As a method for encapsulating elements using the epoxy resin composition for encapsulating a semiconductor of the present invention, low-pressure transfer molding is the most generally used method, but injection molding, compression molding and the like may also be employed. When the epoxy resin composition for encapsulating a semiconductor is in a liquid form or a paste form at normal temperature, a dispense system, a casting system, a printing system and the like may also be used.

Furthermore, there is not only a common encapsulating method involving directly encapsulating elements with a resin, but there is also a hollow package method in which an epoxy resin composition for encapsulating a semiconductor is not come into contact with elements. The epoxy resin composition can also be suitably used as an epoxy resin composition for encapsulating a semiconductor for use in hollow packages.

Furthermore, the epoxy resin composition for encapsulating a semiconductor of the present invention is excellent in adhesion to copper oxide, mold releasability, continuous molding property and the like. When electronic components such as IC, LSI and the like are encapsulated using this epoxy resin composition for encapsulating a semiconductor, a semiconductor device excellent in the reliability can be obtained.

EXAMPLES

The present invention is now illustrated in detail below with reference to Examples. However, the present invention is not restricted to these Examples.

Synthesis Example 1

Synthesis of a compound (D) having a copolymer of α-olefin having 28 to 60 carbon atoms and a maleic anhydride esterified with monohydric alcohol having 18 carbon atoms 300 g of a copolymer of a mixture consisting of 1-octacosene, 1-triacontene, 1-tetracontene, 1-pentacontene, 1-hexacontene and the like, and a maleic anhydride (product name: Diacarna (registered trademark) 30, commercially available from Mitsubishi Chemical Corporation), and 140 g of stearyl alcohol were dissolved in 500 ml of toluene. The resulting solution was reacted at 110 degrees centigrade for 8 hours, and then toluene was removed while heating the solution up to 160 degrees centigrade step by step and the unreacted components were removed by conducting the reaction under reduced pressure at 160 degrees centigrade for 6 hours, whereby 489 g of a compound 1 of the desired monoesterification rate of 100% by mole was obtained. The molecular weight was measured according to the gel permeation chromatography in terms of polystyrene using tetrahydrofuran as an eluent and as a result, the number average molecular weight (Mn) was 4,100, the molecular weight distribution (Mw/Mn) was 3.52, and the amount of remained unreacted stearyl alcohol was equal to or less than 1%, based on the total compound 1.

100 g of the aforementioned compound 1 was dissolved in 400 ml of acetone, and 300 ml of n-hexane was added thereto. The precipitate was filtered off and dried, whereby 70 g of a high molecular weight compound 1 was obtained. The molecular weight was measured according to the gel permeation chromatography in terms of polystyrene using tetrahydrofuran as an eluent and as a result, the number average molecular weight (Mn) was 5,600 and the molecular weight distribution (Mw/Mn) was 1.82. Furthermore, the solvent was removed from the supernatant and dried, whereby 20 g of a low molecular weight compound 1 was obtained. The molecular weight was measured according to the gel permeation chromatography in terms of polystyrene using tetrahydrofuran as an eluent and as a result, the number average molecular weight (Mn) was 2,400 and the molecular weight distribution (Mw/Mn) was 2.21.

Synthesis Example 2

Synthesis of a compound (D) having a copolymer of α-olefin having 28 to 60 carbon atoms and a maleic anhydride esterified with monohydric alcohol having 12 carbon atoms 385 g of a compound 2 of the monoesterification rate of 100% by mole was obtained according to the method described in Synthesis Example 1, except that 97 g of 1-dodecanol was added instead of stearyl alcohol. The molecular weight was measured according to the gel permeation chromatography in terms of polystyrene using tetrahydrofuran as an eluent and as a result, the number average molecular weight (Mn) was 3,800, the molecular weight distribution (Mw/Mn) was 3.81, and the amount of remained unreacted 1-dodecanol was equal to or less than 1%, based on the total compound 2.

Synthesis Example 3

Synthesis of a compound (D) having a copolymer of α-olefin having 28 to 60 carbon atoms and a maleic anhydride esterified with monohydric alcohol having 22 carbon atoms 458 g of a compound 3 of the monoesterification rate of 100% by mole was obtained according to the method described in Synthesis Example 1, except that 170 g of behenyl alcohol (product name Kalcol 220-80, commercially available from Kao Corporation) was added instead of stearyl alcohol. The molecular weight was measured according to the gel permeation chromatography in terms of polystyrene using tetrahydrofuran as an eluent and as a result, the number average molecular weight (Mn) was 4,400, the molecular weight distribution (Mw/Mn) was 3.55, and the amount of remained unreacted behenyl alcohol was equal to or less than 1%, based on the total compound 3.

Synthesis Example 4

Synthesis of a compound (D) having a copolymer of α-olefin having 20 to 24 carbon atoms and a maleic anhydride esterified with monohydric alcohol having 18 carbon atoms 180 g of a mixture consisting of 1-eicosene, 1-docosene and 1-tetracosene (product name: Linealene 2024, commercially available from Idemitsu Kosan Co., Ltd.), and 58 g of a maleic anhydride were dissolved in 500 ml of toluene, and 0.16 g of BPO was added thereto three times every 20 minutes while heating the resulting mixture at 110 degrees centigrade. After completion of addition of BPO, the reaction solution was further heated at 110 degrees centigrade for 7 hours. 162 g of stearyl alcohol was added to a toluene solution of the copolymer and reacted at 110 degrees centigrade for 8 hours. Then, toluene was removed while heating the resulting mixture up to 160 degrees centigrade step by step, and the unreacted components were removed by conducting the reaction under reduced pressure at 160 degrees centigrade for 6 hours, whereby 380 g of a compound 4 of the desired monoesterification rate of 100% by mole was obtained. The molecular weight was measured according to the gel permeation chromatography in terms of polystyrene using tetrahydrofuran as an eluent and as a result, the number average molecular weight (Mn) was 9,800, the molecular weight distribution (Mw/Mn) was 2.63, and the amount of remained unreacted stearyl alcohol was equal to or less than 1%, based on the total compound 4.

Synthesis Example 5

Synthesis of a compound (D) having a copolymer of α-olefin having 28 to 60 carbon atoms and a maleic anhydride esterified with monohydric alcohol having 8 carbon atoms 340 g of a compound 5 of the monoesterification rate of 100% by mole was obtained according to the method described in Synthesis Example 1, except that 68 g of 1-octanol was added instead of stearyl alcohol. The molecular weight was measured according to the gel permeation chromatography in terms of polystyrene using tetrahydrofuran as an eluent and as a result, the number average molecular weight (Mn) was 3,700, the molecular weight distribution (Mw/Mn) was 3.80, and the amount of remained unreacted 1-octanol was equal to or less than 1%, based on the total compound 5.

Synthesis Example 6

Synthesis of a compound (D) having a copolymer of α-olefin having 28 to 60 carbon atoms and a maleic anhydride esterified with monohydric alcohol having 28 carbon atoms 506 g of a compound 6 of the monoesterification rate of 100% by mole was obtained according to the method described in Synthesis Example 1, except that 214 g of octacosanol (product name Policosanol (derived from rice bran), commercially available from Functional Material Laboratory Co., Ltd.) was added instead of stearyl alcohol. The molecular weight was measured according to the gel permeation chromatography in terms of polystyrene using tetrahydrofuran as an eluent and as a result, the number average molecular weight (Mn) was 4,800, the molecular weight distribution (Mw/Mn) was 3.91, and the amount of remained unreacted octacosanol was equal to or less than 1%, based on the total compound 6.

Components used in Examples 1 to 10 and Comparative Examples 1 to 9 are shown below.

(A) Component: Epoxy Resin

Biphenyl type epoxy resin (product name: Epicoat YX-4000K, commercially available from Japan Epoxy Resin Co., Ltd., epoxy equivalent: 185, melting point: 108 degrees centigrade)

Paraxylylene type epoxy resin (product name: NC2000, commercially available from Nippon Kayaku Co., Ltd., epoxy equivalent: 237, softening point: 52 degrees centigrade)

Phenol aralkyl type epoxy resin having a biphenylene skeleton (referred to as the biphenyl aralkyl type epoxy resin) (product name: NC-3000L, commercially available from Nippon Kayaku Co., Ltd., epoxy equivalent: 273, softening point: 52 degrees centigrade)

(B) Component: Curing Agent

Phenol aralkyl type phenol resin having a biphenylene skeleton (referred to as the biphenyl aralkyl resin) (product name: MEH-7851SS, commercially available from Meiwa Plastic Industries, Ltd., hydroxyl equivalent: 199, softening point: 64 degrees centigrade)

(C) Component: Inorganic Filler

Fused spherical silica (product name: Denka fused silica (DF) spherical powder type (Grade FB-105), commercially available from Denki Kagaku Kogyo Kabushiki Kaisha, average particle diameter: 10.8 μm, surface specific area: 5.1 $m^2/g$)

(D) Component: Mold Releasing Agent

Compounds 1 to 6 obtained in the above Synthesis Examples

Polyethylene oxide wax (product name: PED191, commercially available from Clariant Co., Ltd.), montanoic acid type wax (product name: Licowax E, commercially available from Clariant Co., Ltd.), α-olefin monomer (product name: Alpha Olefin C30+, commercially available from Chevron Phillips Chemical Company) as other mold releasing agents (E) Component: Curing Accelerator Adduct of triphenylphosphine and p-benzoquinone (product name: TPP-BQ, commercially available from Hokko Chemical Industry Co., Ltd.)

Siloxane Addition Polymer Modified Product

Silicon oil A (a melt reactant obtained by heating a compound represented by the following formula (IX) (BY-750, commercially available from Dow Corning Toray Co., Ltd., molecular weight: about 1,500) and a bisphenol A type epoxy resin (JER (registered trademark) YL-6810, commercially available from Japan Epoxy Resin Co., Ltd., epoxy equivalent: 172 g/eq, melting point: 45 degrees centigrade) in an amount of 12 parts by mass at 140 degrees centigrade for melting, adding 6 parts by mass of G1-1 and 0.15 parts by mass of triphenylphosphine thereto, and melt-mixing the resulting material at 140 degrees centigrade for 30 minutes),

[Chemical Formula 12]

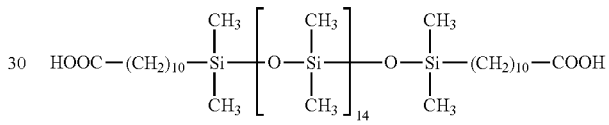

(IX)

Silicon oil B (a compound represented by the following formula (X), wherein, in the formula (X), m, n, l, a and b are each the same or different integer (product name: FZ-3730, commercially available from Dow Corning Toray Co., Ltd.)),

[Chemical Formula 13]

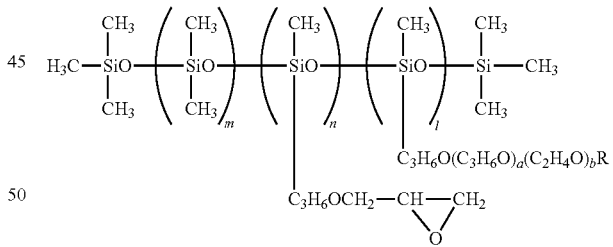

(X)

Coupling Agent

γ-glycidoxypropyltrimethoxysilane (product name: S510=GPS-M, commercially available from Chisso Corporation)

Coloring Agent

Carbon black (product name: Carbon No. 5, commercially available from Mitsubishi Chemical Corporation)

The aforementioned components were mixed in parts by mass shown in Tables 1 and 2 respectively, and biaxially kneaded under the conditions of a kneading temperature of 100 degrees centigrade and a kneading time of 30 minutes followed by cooling and pulverizing, whereby an epoxy resin composition for encapsulating a semiconductor was prepared. Incidentally, Compounds 1 and 4 and the polyethylene oxide wax in Comparative Examples 4 and 5 were used by preliminary kneading with the biphenyl type epoxy resin at a temperature of 170 degrees centigrade for 6 hours.

TABLE 1

Mixing Formulations

| Mixing component | Example | | | | |
|---|---|---|---|---|---|
| | 1 | 2 | 3 | 4 | 5 |
| Biphenyl type epoxy resin | 3.01 | 3.01 | 3.01 | 3.01 | 3.01 |
| Paraxyylene type epoxy resin | 3.01 | 3.01 | 3.01 | 3.01 | 3.01 |
| Biphenyl aralkyl type epoxy resin | | | | | |
| Biphenyl aralkyl resin | 5.18 | 5.18 | 5.18 | 5.18 | 5.18 |
| Curing accelerator | 0.27 | 0.27 | 0.27 | 0.27 | 0.27 |
| Inorganic filler | 88 | 88 | 88 | 88 | 88 |
| Compound 1 | 0.2 | | | | |
| High molecular weight compound 1 | | 0.2 | | | |
| Low molecular weight compound 1 | | | 0.2 | | |
| Compound 2 | | | | 0.2 | |
| Compound 3 | | | | | 0.2 |
| Compound 4 | | | | | |
| Compound 5 | | | | | |
| Compound 6 | | | | | |
| Montanoic acid wax | | | | | |
| Polyethylene oxide wax | | | | | |
| α-olefin monomer | | | | | |
| Silicon oil A | | | | | |
| Silicon oil B | | | | | |
| Coupling agent | 0.03 | 0.03 | 0.03 | 0.03 | 0.03 |
| Coloring agent | 0.3 | 0.3 | 0.3 | 0.3 | 0.3 |

| Mixing component | Example | | | | |
|---|---|---|---|---|---|
| | 6 | 7 | 8 | 9 | 10 |
| Biphenyl type epoxy resin | 2.97 | 2.97 | 5.94 | | 3.01 |
| Paraxyylene type epoxy resin | 2.97 | 2.97 | | | 3.01 |
| Biphenyl aralkyl type epoxy resin | | | | 5.94 | |
| Biphenyl aralkyl resin | 5.11 | 5.11 | 5.11 | 5.11 | 5.18 |
| Curing accelerator | 0.27 | 0.27 | 0.27 | 0.27 | 0.27 |
| Inorganic filler | 88 | 88 | 88 | 88 | 88 |
| Compound 1 | 0.2 | 0.2 | 0.2 | 0.2 | 0.13 |
| High molecular weight compound 1 | | | | | |
| Low molecular weight compound 1 | | | | | |
| Compound 2 | | | | | |
| Compound 3 | | | | | |
| Compound 4 | | | | | |
| Compound 5 | | | | | |
| Compound 6 | | | | | |
| Montanoic acid wax | | | | | |
| Polyethylene oxide wax | | | | | |
| α-olefin monomer | | | | | 0.07 |
| Silicon oil A | 0.15 | | 0.15 | 0.15 | |
| Silicon oil B | | 0.15 | | | |
| Coupling agent | 0.03 | 0.03 | 0.03 | 0.03 | 0.03 |
| Coloring agent | 0.3 | 0.3 | 0.3 | 0.3 | 0.3 |

TABLE 2

Mixing Formulations

| Mixing component | Comparative Example | | | | |
|---|---|---|---|---|---|
| | 1 | 2 | 3 | 4 | 5 |
| Biphenyl type epoxy resin | 3.01 | 3.01 | 3.01 | 3.01 | 3.01 |
| Paraxyylene type epoxy resin | 3.01 | 3.01 | 3.01 | 3.01 | 3.01 |
| Biphenyl aralkyl type epoxy resin | | | | | |
| Biphenyl aralkyl resin | 5.18 | 5.18 | 5.18 | 5.18 | 5.18 |
| Curing accelerator | 0.27 | 0.27 | 0.27 | 0.27 | 0.27 |
| Inorganic filler | 88 | 88 | 88 | 88 | 88 |
| Compound 1 | | | | 0.1 | |
| High molecular weight compound 1 | | | | | |
| Low molecular weight compound 1 | | | | | |
| Compound 2 | | | | | |
| Compound 3 | | | | | |
| Compound 4 | 0.2 | | | | 0.1 |
| Compound 5 | | 0.2 | | | |
| Compound 6 | | | 0.2 | | |
| Montanoic acid wax | | | | | |
| Polyethylene oxide wax | | | | 0.1 | 0.1 |
| α-olefin monomer | | | | | |
| Silicon oil A | | | | | |
| Silicon oil B | | | | | |
| Coupling agent | 0.03 | 0.03 | 0.03 | 0.03 | 0.03 |
| Coloring agent | 0.3 | 0.3 | 0.3 | 0.3 | 0.3 |

| Mixing component | Comparative Example | | | |
|---|---|---|---|---|
| | 6 | 7 | 8 | 9 |
| Biphenyl type epoxy resin | 3.01 | 3.01 | 3.01 | 2.97 |
| Paraxyylene type epoxy resin | 3.01 | 3.01 | 3.01 | 2.97 |
| Biphenyl aralkyl type epoxy resin | | | | |
| Biphenyl aralkyl resin | 5.18 | 5.18 | 5.18 | 5.11 |
| Curing accelerator | 0.27 | 0.27 | 0.27 | 0.27 |
| Inorganic filler | 88 | 88 | 88 | 88 |
| Compound 1 | | | | |
| High molecular weight compound 1 | | | | |
| Low molecular weight compound 1 | | | | |
| Compound 2 | | | | |
| Compound 3 | | | | |
| Compound 4 | 0.1 | | | |
| Compound 5 | | | | |
| Compound 6 | | | | |
| Montanoic acid wax | 0.1 | | 0.2 | 0.2 |
| Polyethylene oxide wax | | 0.2 | | |
| α-olefin monomer | | | | |
| Silicon oil A | | | | 0.15 |
| Silicon oil B | | | | |
| Coupling agent | 0.03 | 0.03 | 0.03 | 0.03 |
| Coloring agent | 0.3 | 0.3 | 0.3 | 0.3 |

The prepared epoxy resin compositions for encapsulating a semiconductor in Examples and Comparative Examples were evaluated according to the following respective tests. The evaluation results are shown in Tables 3 and 4.

(1) Adhesion

A copper oxide base material and a tableted epoxy resin composition for encapsulating a semiconductor were integrally molded under the conditions of 175 degrees centigrade, 70 kg/cm$^2$ and 2 minutes to obtain a truncated molded product (upper diameter 2 mm×lower diameter 3 mm×thickness 3 mm). Then, a base material of the resulting respective molded products was fixed and a curing portion of the epoxy resin composition for encapsulating a semiconductor was pressed from the transverse direction to measure its torque (N).

(2) Releasing Load

Figure 2:
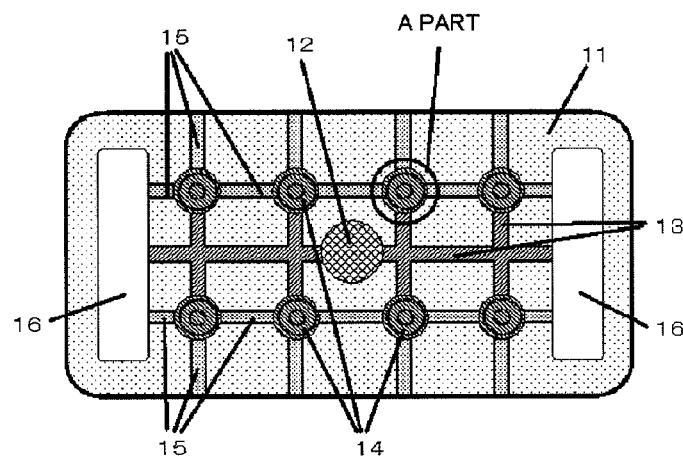
FIG. 2 is a schematic plan view illustrating a state of a middle mold after molding in a mold for evaluating a load during mold releasing of the epoxy resin composition for encapsulating a semiconductor of the present invention.

A mold for evaluating a load during mold releasing is composed of an upper mold, a middle mold and a lower mold as a mold for transfer molding. FIG. 2 illustrates a schematic plan view of the middle mold after molding. As the shape of the molded product to be attached to the middle mold after molding, the diameter is 14.0 mm and the height is 1.5 mm (thickness). In FIG. 2, 11 indicates a middle mold, 12 indicates a curl, and 13 indicates a runner. 14 indicates a molded product and 15 indicates an air vent. 16 indicates a handle and 17 indicates a hole for inserting a push-pull gauge respectively.

Figure 3:
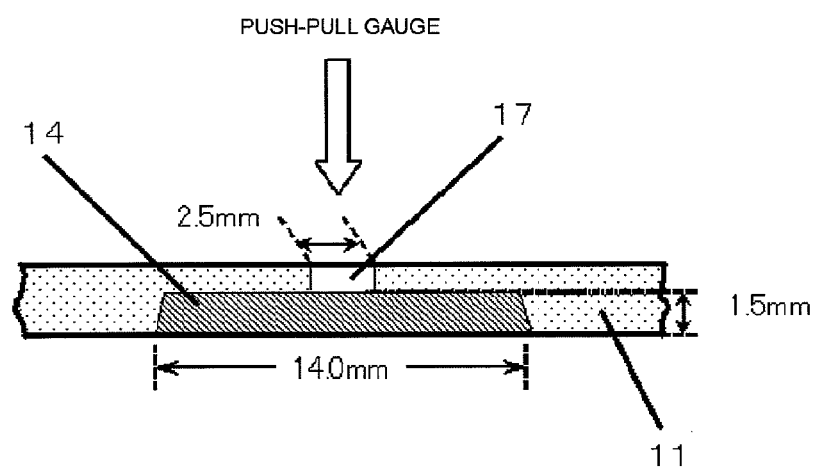
FIG. 3 is a schematic view illustrating a cross-section structure of an A part in the vicinity of a molded product in the middle mold of FIG. 2.

An evaluation material was subjected to transfer molding under the conditions of a mold temperature of 175 degrees centigrade, an injection pressure of 6.9 MPa and a curing time of 1 minute using the mold for evaluating a load during mold releasing shown in FIG. 2. The push-pull gauge was put on the circular molded product 14 attached to the middle mold 11 after molding from the hole 17 on the top of the middle mold (see FIG. 3) to measure a load applied when protruding the molded product. Subsequently, after 20 shots of the evaluation material were molded, half 10 shots of the molded product were measured. The average value was evaluated as a releasing load.

(3) Continuous Molding Property (Air Vent Block, Mold Stain and Package Stain)

A 80 pin quad flat package (80pQFP; a cu lead frame, package size: 14 mm×20 mm×2 mm (thickness), pad size: 6.5 mm×6.5 mm, chip size: 6.0 mm×6.0 mm×0.35 mm (thickness)) was encapsulated, and up to 400 shots of molding was performed in a continuous manner under the conditions of a mold temperature of 175 degrees centigrade, an injection pressure of 9.8 MPa and a curing time of 70 seconds using a low pressure automatic transfer molding machine (GP-ELF, commercially available from Dai-ichi Seiko Co., Ltd.).

The presence or absence of an air vent block was confirmed by visually observing the mold every 50 shots, and evaluated in the following four steps.

A: No problem caused up to 400 shots
B: Air vent block observed at 300 shots
C: Air vent block observed at 200 shots
D: Air vent block observed at 100 shots With respect to mold stain, the mold of 400 shots was observed and evaluated in the following five steps depending on the degree of spread of stain from a gate opening.

A: No stain
B: Degree of spread of stain of equal to or less than 10% by area of the mold surface
C: Degree of spread of stain of exceeding 10% by area and equal to or less than 20% by area of the mold surface
D: Degree of spread of stain of exceeding 20% by area and equal to or less than 50% by area of the mold surface
E: Degree of spread of stain of exceeding 50% by area of the mold surface With respect to package stain, the package of 400 shots was observed and evaluated in the following five steps depending on the degree of spread of stain from a gate opening.

A: No stain
B: Degree of spread of stain of equal to or less than 10% by area of the package surface
C: Degree of spread of stain of exceeding 10% by area and equal to or less than 20% by area of the package surface
D: Degree of spread of stain of exceeding 20% by area and equal to or less than 50% by area of the package surface
E: Degree of spread of stain of exceeding 50% by area of the package surface With respect to package stain, the package of 400 shots was observed and evaluated in the following five steps depending on the degree of spread of stain from a gate opening.

A: No stain
B: Degree of spread of stain of equal to or less than 10% by area of the package surface
C: Degree of spread of stain of exceeding 10% by area and equal to or less than 20% by area of the package surface
D: Degree of spread of stain of exceeding 20% by area and equal to or less than 50% by area of the package surface
E: Degree of spread of stain of exceeding 50% by area of the package surface

TABLE 3

Evaluation results

| Evaluation Item | Example |||||
| --- | --- | --- | --- | --- | --- |
|  | 1 | 2 | 3 | 4 | 5 |
| Oxide Cu adhesive strength (N) | 15 | 15 | 15 | 15 | 15 |
| Releasing load (N) | 10 | 10 | 10 | 10 | 10 |
| Continuous molding property (air vent block) | A | A | A | A | A |
| Continuous molding property (mold stain) | B | B | B | B | B |
| Package stain | B | B | B | B | B |

| Evaluation Item | Example |||||
| --- | --- | --- | --- | --- | --- |
|  | 6 | 7 | 8 | 9 | 10 |
| Oxide Cu adhesive strength (N) | 15 | 15 | 16 | 16 | 15 |
| Releasing load (N) | 8 | 8 | 8 | 8 | 10 |
| Continuous molding property (air vent block) | A | A | A | A | A |
| Continuous molding property (mold stain) | A | A | B | A | C |
| Package stain | A | A | B | A | C |

TABLE 4

Evaluation results

| Evaluation Item | Comparative Example |||||
| --- | --- | --- | --- | --- | --- |
|  | 1 | 2 | 3 | 4 | 5 |
| Oxide Cu adhesive strength (N) | 14 | 15 | 14 | 8 | 8 |
| Releasing load (N) | 15 | 15 | 15 | 10 | 10 |
| Continuous molding property (air vent block) | D | D | D | C | C |
| Continuous molding property (mold stain) | D | D | D | C | C |
| Package stain | D | D | D | C | C |

| Evaluation Item | Comparative Example ||||
| --- | --- | --- | --- | --- |
|  | 6 | 7 | 8 | 9 |
| Oxide Cu adhesive strength (N) | 14 | 6 | 10 | 11 |
| Releasing load (N) | 15 | 10 | 12 | 12 |
| Continuous molding property (air vent block) | C | D | B | B |
| Continuous molding property (mold stain) | D | B | D | D |
| Package stain | D | B | D | D |

Examples 1 to 5 were excellent in all adhesion strength to copper oxide and mold releasability (releasing load). Also, in Examples 6 and 7 containing the silicon oil component as the siloxane addition polymer modified product, adhesion strength to copper oxide and mold releasability (releasing load) were excellent, and continuous molding property (mold stain) was further improved. Also, in Examples 8 and 9 containing the silicon oil component using the total amount of a biphenyl type epoxy resin or a phenol aralkyl type epoxy resin having a biphenylene skeleton (biphenyl aralkyl type epoxy resin) as the epoxy resin (A), mold releasability (releasing load) was excellent and adhesion strength to copper oxide was further improved. In Example 10 containing 35% by mass of α-olefin monomer in the compound (D), adhesion strength to copper oxide and mold releasability (releasing load) were excellent as compared to Comparative Examples. In Comparative Examples 1 to 3, mold releasability (releasing load) was inferior. Furthermore, in Comparative Examples 4, 5 and 7 employing a polyethylene oxide wax as the mold releasing agent component together, continuous molding property (air vent block) was not excellent and adhesion to copper oxide was considerably inhibited as well. Comparative Example 5 corresponds to Example 1 described in Patent Document 1 or 2. In Comparative Examples 8 and 9 employing a montanoic acid type mold releasing agent, adhesion strength to copper oxide was weak and mold releasability (releasing load) was inferior as well.

This application is based on Japanese patent application No. 2009-241427 filed on Oct. 20, 2009, Japanese patent application No. 2010-070700 filed on Mar. 25, 2010, and Japanese patent application No. 2010-102429 filed on Apr. 27, 2010, the contents of which are incorporated hereinto by reference.

The invention claimed is:

1. A semiconductor device comprising a copper-containing lead frame and a semiconductor element,
wherein the semiconductor element is encapsulated with a cured product of an epoxy resin composition for encapsulating a semiconductor,
wherein the epoxy resin composition comprises an epoxy resin (A), a curing agent (B), an inorganic filler (C), and a mold releasing agent,
said mold releasing agent contains a compound (D) having a copolymer of an α olefin having 28 to 60 carbon atoms and a maleic anhydride esterified with a long chain aliphatic monohydric alcohol having 12 to 22 carbon atoms;
the compound (D) contains the copolymer of α-olefin having 43 to 60 carbon atoms and a maleic anhydride esterified with a long chain aliphatic monohydric alcohol having 12 to 22 carbon atoms; and
a content of said compound (D) having the copolymer of α-olefin having 28 to 60 carbon atoms and maleic anhydride esterified with the long chain aliphatic monohydric alcohol having 12 to 22 carbon atoms is equal to or more than 55% by mass and equal to or less than 100% by mass, based on 100% by mass of the total amount of said mold releasing agent.

2. The semiconductor device according to claim 1, the epoxy resin composition further comprising a siloxane addition polymer modified product represented by the following general formula (I):

[Chemical Formula 1]

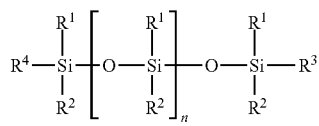

(I)

wherein in the formula:
R$^1$ to R$^2$ are selected from a hydrogen atom, a substituted or unsubstituted hydrocarbon group having 1 to 55 carbon atoms, an alkyleneoxy glycidyl ether group and an alkylene oxide group, and all are the same or different from each other;
R$^3$ to R$^4$ are selected from a hydrogen atom, a substituted or unsubstituted hydrocarbon group having 1 to 10 carbon atoms, an amino group, a carboxyl group, a glycidyl ether group, and an alkylcarboxylic acid-4,4'(1-methylethylidene)bisphenol diglycidyl ether group, and all are the same or different from each other; and
n represents an integer of from 1 to 100.

3. The semiconductor device according to claim 2, wherein the content of said siloxane addition polymer modified product is equal to or more than 0.1% by mass and equal to or less than 2% by mass, based on 100% by mass of the total amount of said epoxy resin composition.

4. The semiconductor device according to claim 1, wherein said epoxy resin (A) comprises at least one kind of resin selected from the group consisting of a biphenyl type epoxy resin, a paraxylylene type epoxy resin and a phenol aralkyl type epoxy resin having a biphenylene skeleton.

5. The semiconductor device according to claim 1, wherein the compound (D) contains the copolymer of the α-olefin having 50 carbon atoms and the maleic anhydride esterified with a long chain aliphatic monohydric alcohol having 12 to 22 carbon atoms.

6. The semiconductor device according to claim 1, wherein the
compound (D) contains the copolymer of the α-olefin having 60 carbon atoms and a maleic anhydride esterified with a long chain aliphatic monohydric alcohol having 12 to 22 carbon atoms.

7. The semiconductor device according to claim 1, wherein the number average molecular weight of the compound (D) is equal to or more than 2,000 and equal to or less than 10,000.

8. The semiconductor device according to claim 1, wherein the mixing amount of the compound (D) is equal to or more than 1% by mass and equal to or less than 5% by mass, based on 100% by mass of the total amount of the epoxy resin (A).

9. The semiconductor device according to claim 1, wherein the compound (D)
contains the copolymer of α-olefin having 50 to 60 carbon atoms and a maleic anhydride esterified with a long chain aliphatic monohydric alcohol having 12 to 22 carbon atoms.

* * * * *